United States Patent
Nomura et al.

(10) Patent No.: US 6,601,132 B2
(45) Date of Patent: Jul. 29, 2003

(54) NONVOLATILE MEMORY AND METHOD OF WRITING DATA THERETO

(75) Inventors: Katsuyuki Nomura, Hino (JP); Akihisa Fujimoto, Fussa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/949,796

(22) Filed: Sep. 12, 2001

(65) Prior Publication Data

US 2002/0039312 A1 Apr. 4, 2002

(30) Foreign Application Priority Data

Sep. 29, 2000 (JP) ........................................ 2000-301521

(51) Int. Cl.$^7$ .......................... G06F 12/00; G11C 16/00
(52) U.S. Cl. .................. 711/103; 711/162; 365/185.33; 365/185.09; 714/7; 714/8
(58) Field of Search ................................. 711/103, 162; 365/185.33, 185.09; 714/7, 8

(56) References Cited

U.S. PATENT DOCUMENTS

| | | | | |
|---|---|---|---|---|
| 5,577,194 A | * | 11/1996 | Wells et al. ................. | 365/218 |
| 5,644,539 A | * | 7/1997 | Yamagami et al. ..... | 365/185.33 |
| 5,907,856 A | * | 5/1999 | Estakhri et al. ............. | 711/103 |
| 5,956,473 A | * | 9/1999 | Ma et al. ........................ | 714/5 |
| 6,014,755 A | * | 1/2000 | Wells et al. ................. | 365/218 |
| 6,098,077 A | * | 8/2000 | Sassa ......................... | 707/202 |
| 6,119,245 A | * | 9/2000 | Hiratsuka .............. | 365/185.09 |

FOREIGN PATENT DOCUMENTS

JP 9-54726 2/1997

* cited by examiner

*Primary Examiner*—Hong Kim
(74) *Attorney, Agent, or Firm*—Finnegan, Henderson, Farabow, Garrett, & Dunner, L.L.P.

(57) ABSTRACT

A rewritable nonvolatile memory comprises a block usage control table indicating a usage status of each block of the nonvolatile memory. When the data is written, it is determined whether or not the data is correctly written. If it is determined that the data is not correctly written, the block address is stored as a candidate address of a defective block and writing operation is performed for another block. If it is determined that the data is correctly written, the block usage control table is updated such that the usage status of the candidate of a defective block and the present block is changed to a used status.

10 Claims, 4 Drawing Sheets

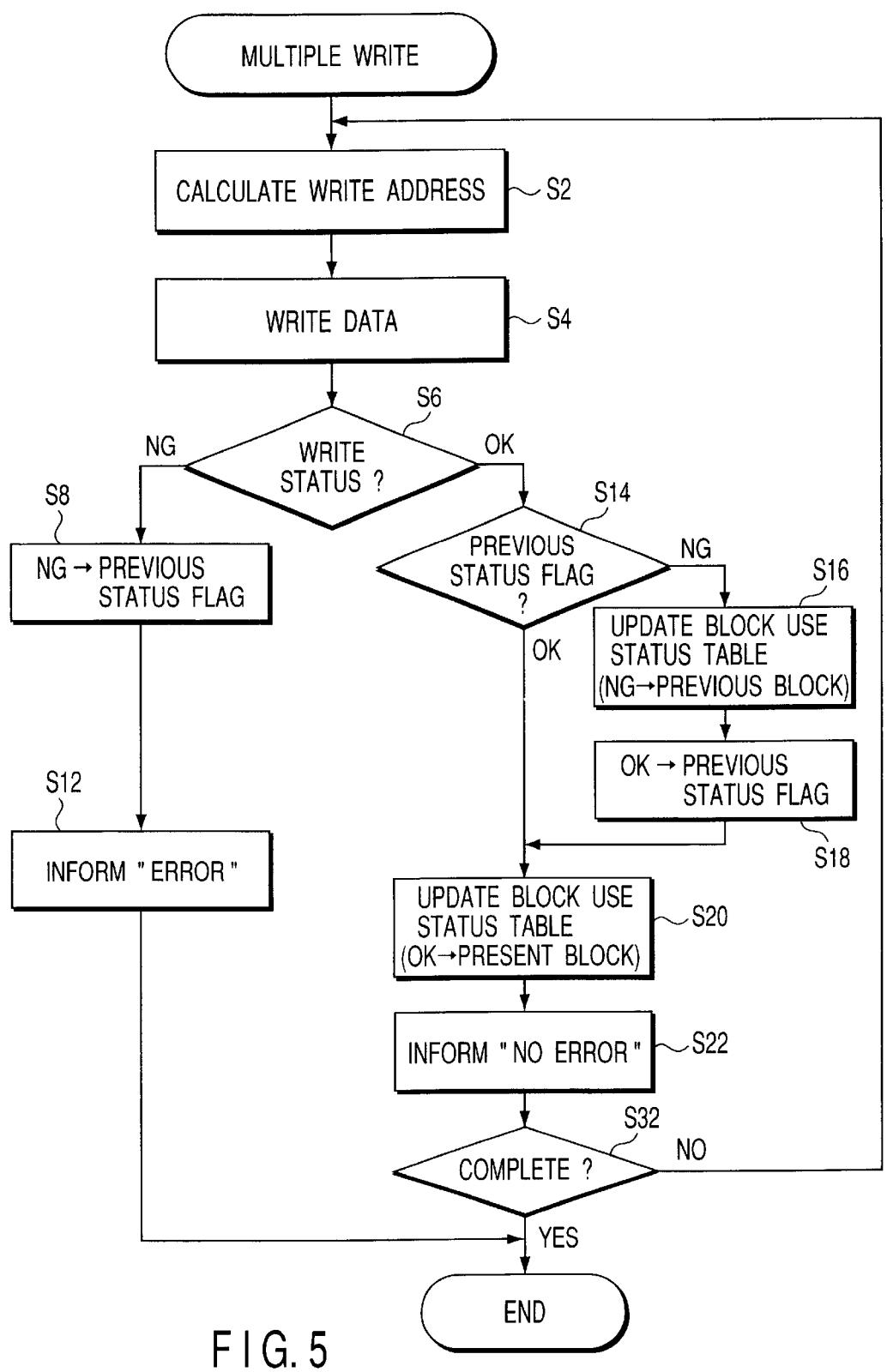
F I G. 5

NONVOLATILE MEMORY AND METHOD OF WRITING DATA THERETO

CROSS-REFERENCE TO RELATED APPLICATIONS

This application is based upon and claims the benefit of priority from the prior Japanese Patent Application No. 2000-301521, filed Sep. 29, 2000, the entire contents of which are incorporated herein by reference.

BACKGROUND OF THE INVENTION

1. Field of the Invention

The present invention relates to determination of a write error of a nonvolatile memory during a write operation, and in particular, to a method of writing data to a nonvolatile memory that can distinguish errors resulting from faults in the entire system from errors resulting from defects only in the memory, as well as the nonvolatile memory incorporating such a determining function.

2. Description of the Related Art

As storage devices in which various digital information represented by image or music data is saved, stamp-sized memory cards has recently become popular which comprises a rewritable nonvolatile semiconductor memory mounted therein and preventing saved information from being lost even if a power supply is turned off.

Typical rewritable nonvolatile memories include NAND type flash memories. This type of flash memory is controlled for each block of a fixed size (for example, 512 bytes), and unused blocks are indicated by status data "1." Once the write operation for a block is completed, the status data for the block is changed from "1" to "0". After the data is written, it is determined whether or not the data is correctly written. Not only if the data is correctly written but also if a write error is occurred, the status data for that block is changed from "1" to "0" to inhibit the subsequent use thereof. A retry process is executed for data that is not correctly written to a certain block. If a write error occurs during this retry process, the status data for that block is also changed to "0".

The write to the nonvolatile memory involves two operations: a single-write operation that is completed by writing data to one block, the smallest write unit, and a multiple-write operation that is completed by repeating a single write a number of times. If, however, a write error occurs, the same process is executed in both cases.

If the write operation is completed, it is determined whether or not the data is correctly written, and a block to which the data is not correctly written is determined to be defective and its status data is changed from "1" to "0" to inhibit the subsequent use thereof. The determination of a defective block results not only from a memory factor but also from a system-wise factor (for example, an insufficient write voltage). Thus, when the status data for a defective block is changed from "1" to "0" so as to be immediately inhibited from subsequent use of the block, that block cannot be used even if the write error arises from a system-wise factor but the memory is not defective. Thus, the conventional method of writing data to the nonvolatile memory may consider normal blocks as abnormal, thereby unnecessarily reducing the capacity of the memory card to shorten its lifetime.

BRIEF SUMMARY OF THE INVENTION

It is an object of the present invention to provide a method of writing data to a nonvolatile memory as well as a nonvolatile memory that determines whether a write error originates from a system-wise factor (the memory may be normal) or a memory factor, to prevent normal blocks from being considered as abnormal, therefore, the capacity of the nonvolatile memory being prevented from being unnecessarily reduced.

According to one aspect to the present invention, a rewritable nonvolatile memory comprising:

a block usage control table which indicates a usage status of each block of the nonvolatile memory;

a data write section configured to write data;

a determining section configured to determine whether or not the data is correctly written, and storing an address of a given block if it is determined that the data is not correctly written to the given block; and a control table updating section configured to update the block usage control table, if the determining section determines that the data is correctly written to a present block, such that the usage status of the given block and the present block is changed to a used status.

According to another aspect to the present invention, a method of writing data to a rewritable nonvolatile memory comprising a block usage control table which indicates a usage status of each block of the nonvolatile memory, the method comprising:

writing data;

determining whether or not the data is correctly written, and storing an address of a given block if it is determined that the data is not correctly written to the given block; and updating the block usage control table, if it is determined that the data is correctly written to a present block, such that the usage status of the given block and the present block is changed to a used status.

Therefore, according to the present invention, it is determined whether a write error originates from a system-wise factor or a memory factor and normal blocks are prevented from being considered as abnormal.

BRIEF DESCRIPTION OF THE SEVERAL VIEWS OF THE DRAWING

The accompanying drawings, which are incorporated in and constitute a part of the specification, illustrate embodiments of the present invention and, together with the general description given above and the detailed description of the embodiments given below, serve to explain the principles of the present invention in which:

FIGS. 3A and 3B are diagrams showing transition of the contents of the block usage control table;

FIG. 5 is a flow chart showing the operation of a multiple-write process.

DETAILED DESCRIPTION OF THE INVENTION

An embodiment of a method of writing data to a nonvolatile memory as well as a nonvolatile memory according to the present invention will now be described with reference to the accompanying drawings. The nonvolatile memory is embodied as a memory card in this embodiment.

Figures 1, 2:
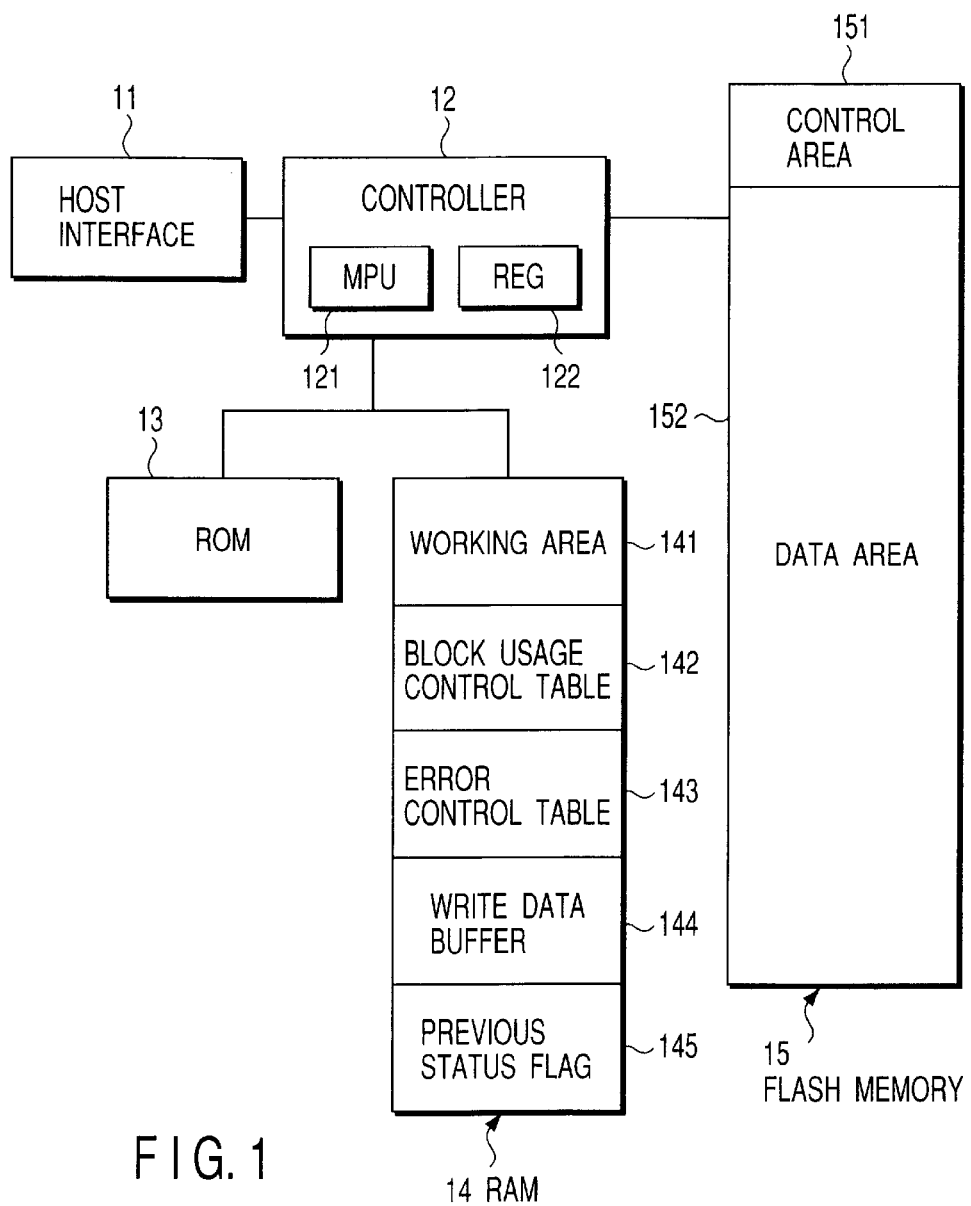
FIG. 1 is a block diagram showing the entire configuration of a memory card according to one embodiment of the present invention.
FIG. 2 is diagram showing an example of an organization of a block usage control table.

FIG. 1 is a block diagram showing the entire configuration of the memory card. This memory card is installed, for example, in various electronic equipment such as a personal computer, an electronic camera, and a game machine, and comprises a host interface 11, a controller 12, a ROM 13, a RAM 14, and a rewritable nonvolatile memory, for example, a NAND type flash memory 15.

The host interface 11 interfaces with an electronic equipment main body (not shown and hereinafter referred to as a "host device") in which the memory card is installed. The controller 12 controls the entire card and has a microprocessor (MPU) 121 and a register 122. The microprocessor 121 interprets and executes commands received via the host interface 11 according to a control program (firmware) stored in the ROM 13.

The ROM 13 is a read-only nonvolatile memory. The ROM 13 is used to store control programs, fixed data for control, and the like.

The RAM 14 is a nonvolatile memory provided with a working area 141 for the controller 12, a block usage control table 142, an error control table 143, a write data buffer 144, a previous status flag 145, and others.

The block usage control table 142 controls the usage status of each block of the flash memory 15 as shown in FIG. 2. The usage status indicates one of the two statuses, that is, whether the block is unused or not (the latter includes used and defective). For each block address, status data "1" is set if the present block is unused, whereas status data "0" is set if it is used or defective. The error control table 143 is used for the multiple-write process. If a write error occurs, that data is registered in the error control table 143 as defective. The write data buffer 144 stores write data blocks transmitted from the host device. The previous status flag 145 is set to indicate a write failure status when a write error occurs. This flag will be described later in detail.

The flash memory 15 comprises a plurality of blocks of a fixed size (for example, 512 bytes) each. The block is the smallest unit of a data write to or a data read from the flash memory 15. Further, the flash memory 15 comprises a control area 151 in which system control information and the like is saved, and a data area 152 in which digital contents such as image and music data are saved. The control area 151 has important information such as contents decryption keys, copy control information, and movement control information saved therein; this information is required to use the digital contents saved in the data area 152.

Now, a process of writing data to the memory card will be described.

Figure 4:
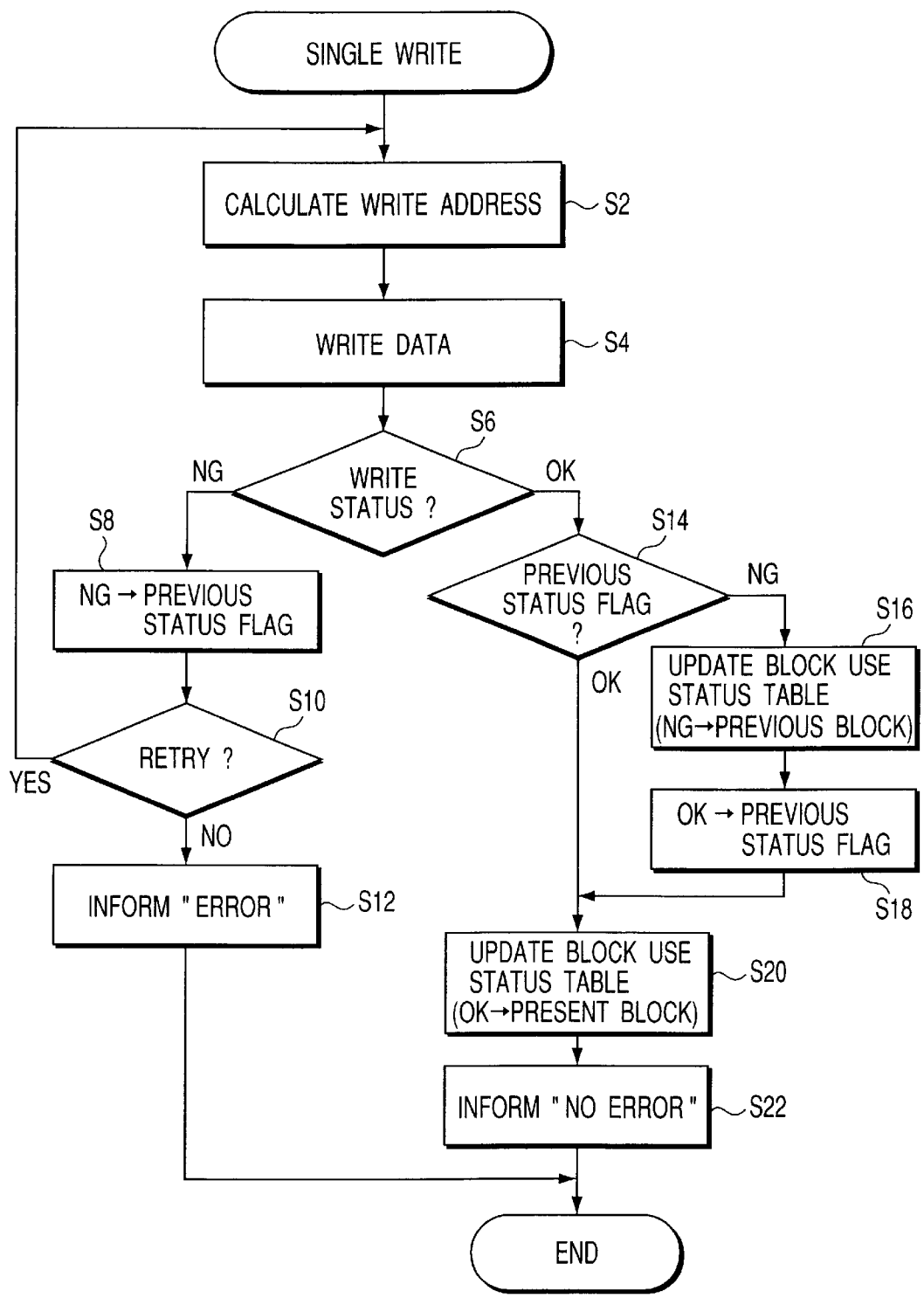
FIG. 4 is a flow chart showing the operation of a single-write process.

First, the single write process will be described with reference to the flow chart shown in FIG. 4.

To execute the single write process according to a command from the host device, the controller 12 finds an unused area and calculates a write address at step S2. That is, the controller 12 finds the unused area by referring to the block usage status data "0" in the block usage control table 142. In this case, the status data "0" is also set for defective blocks and the defective blocks are considered to be used. Accordingly, no defective blocks are used.

At step S4, the controller 12 attempts to write data to a block having the write address. That is, the data is transmitted by the host device and stored in the write data buffer 144 of the RAM 14 on a block-by-block basis.

At step S6, it is determined whether or not the data is correctly written.

In this embodiment, even if it is determined at step S6 that the data is not correctly written, the block usage control table 142 is not immediately updated for that block (the update operation comprises changing the status data from "1" to "0", which is indicative of a used or defective status) as in the prior art. That is, if the data is not correctly written at step S6, then at step S8, the previous status flag 145 is set to indicate a write failure status (the address of the present block is stored as the address of a candidate for a defective block). Then, at step S10, it is determined whether or not a retry is to be continued, on the basis of the number of already executed retries. The initial status of the previous status flags is normal status. At step S10, it is determined whether or not the retry is to be continued, depending on whether or not the number of retries reaches a predetermined value. If the number does not reach the set value, the process returns to step S2 to find another free block to write the data thereto.

If it is determined at step S10 that the number of retries reaches the set value, the process proceeds to step S12 to inform the host device of the error (that the data cannot be written into the memory card). Then, the single write process is ended.

If it is determined that the data is correctly written at step S6, then at step S14, it is determined whether or not the previous status flag 145 indicates a normal status. This is because the system can be assumed to be normal on the basis of the determination that the data is correctly written at step S6 and because if the previous status flag indicates the write failure status, it can be determined that the previous block relating to the previous write operation is defective. Thus, if the previous status flag 145 indicates the write failure status, then at step S16, the block usage control table 142 is updated so that the previous block (the candidate for a defective block) is shown as defective (the status data is changed from "1" to "0").

At step S18, the previous status flag is reset to indicate the normal status, and at step S20, the block usage control table 142 is updated so that the status data of the present block to which the data is correctly written is set to "0". This flow is shown in FIG. 3A.

Figures 3A, 3B:
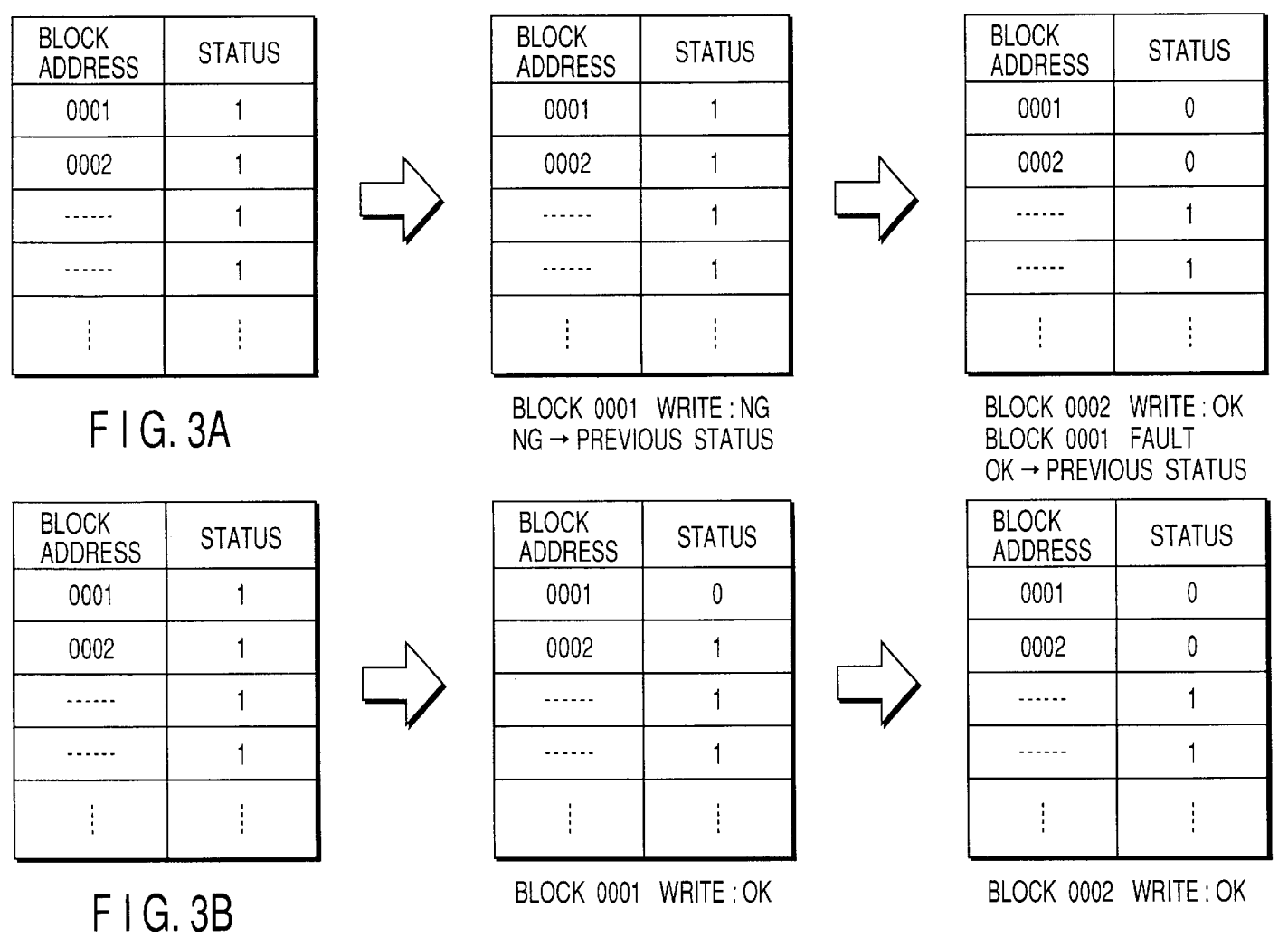

FIG. 3A shows that it is attempted to write data to a block with an address 0001, with the determination that the data is not correctly written and that it is attempted to write data to a block with an address 0002, with the determination that the data is correctly written. If the write error for the address 0001 is detected, the block usage control table is not updated but the previous status flag is set to indicate the abnormal status. If it is determined that the data is correctly written into the block with the address 0002, since the previous status is abnormal, the block usage control table is updated so that the block with the address 0002 is used and the block with the address 0001 is defective by setting the status data "0" for both addresses 0001 and 0002.

If it is determined at step S14 that the previous status flag 145 indicates the normal status, then at step S20, the block usage control table 142 is updated so that the status data of the present block to which the data is correctly written is changed to "0." The flow in the case of the successful write is shown in FIG. 3B.

FIG. 3B shows that it is attempted to write data to the blocks with the addresses 0001 and 0002, with the determination that the data are correctly written in these blocks. Thus, the previous status flag 145 remains indicating the initial status, that is, the normal status. When the write operation for the address 0001 is completed, the status data of the block address 0001 is changed to "0." When the write operation for the address 0002 is completed, the status data of the block address 0002 is changed to "0."

The process proceeds from step S20 to step S22 to inform the host device of the normal status, thereby ending the single write process.

As described above, in the single write, even if an error is detected during a write operation, no defective block is immediately registered in the block usage control table 142. If the retry process is subsequently executed to allow the data to be correctly written, the block usage control table 142 is then updated so that the present block used for this write is shown as used. The block control table 142 is also updated so that the previous block used for the previous write is shown as defective. Thus, the block usage control table 142 is not updated even with a system-wise factor but only if an error occurs only due to a memory factor. Consequently, even if the retry process is repeated, as many defective-block determinations (updating the block usage control table) as the retries need not be executed, thereby preventing the capacity of the nonvolatile memory from being unnecessarily reduced.

Now, a data write process based on multiple writes will be described with reference to the flow chart shown in FIG. 5. The multiple-write process completes a write operation by executing a plurality of single-write operations. For a write error, however, no retry is executed, and the write operation is immediately ended as an error process. This is because an error recovery is executed by the host device. Accordingly, in the multiple-write process, it is determined whether or not the block is defective during a write operation executed in response to a retry request from the host equipment, on the basis of the value of the previous status flag set during a previous multiple-write process.

As in the single-write process, at step S2, the write address is calculated, and at step S4, it is attempted to write the data to the block with the write address. At step S6, it is determined whether or not the data is correctly written.

At step S6, if it is determined that the data is not correctly written, then at step S8, the previous status flag 145 is set to indicate the write error status (the address of the present block is stored as the address of a candidate for a defective block). In contrast to the single-write process, the process proceeds to step S12 to inform the host device of the error (that the data cannot be written), thereby completing the multiple-write process. In contrast to the single-write process, the previous status flag is not reset to indicate the initial status (normal status) even if one write process has ended.

At step S6, if it is determined that the data is correctly written, then at step S14, it is determined whether the previous status flag 145 indicates the normal or write error status. If the previous status flag 145 indicates the write error status, then at step S16, the candidate for a defective block is determined to be a defective block, and the block usage control table 142 is correspondingly updated (the status data of the candidate for a defective block is changed to "0"). At step S18, the previous status flag is reset to indicate the normal status, and then at step S20, the block usage control table 142 is updated so that the status data of the present block to which the data is correctly written is changed to "0."

At step S14, if the previous status flag 145 is determined to indicate the normal status, then at step S20, the block usage control table 142 is updated so that the status data of the present block to which the data is correctly written is changed to "0."

The process proceeds from step S20 to step S22 to inform the host device of the write completion with no error, and at step S32, it is determined whether or not the block write is to be continued. If the block write is to be continued, the process returns to step S2 to search for another unused block in order to write the next data to this block. If the block write is not to be continued, the process is ended.

As described above, the multiple-write process provides effects similar to those of the single write process.

As described above, according to the present invention, even if a write error occurs, the block usage control table is not immediately updated. Instead, the present block is stored as a candidate for a defective block. If the data is correctly written without any error, the block usage control table is updated for this block, and it is determined the candidate for a defective block is a truly defective block. Then, the block usage control table is updated for the candidate for a defective block. That is, the block usage control table is updated only if a write error occurs due to a memory factor. This invention thus provides a method of writing data to a nonvolatile memory as well as a nonvolatile memory that determines whether a write error originates from a system-wise factor (the memory may be normal) or a memory factor, to prevent normal blocks from being considered as abnormal. Consequently, the capacity of the nonvolatile memory is kept from being unnecessarily reduced. Hence, the block usage control table is not updated when a write error occurs due to a system-wise factor, thereby reliably preventing the lifetime of the nonvolatile memory from being reduced.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents. For example, the present invention is implemented in the memory card provided with the nonvolatile memory, but it can be implemented in a nonvolatile memory incorporated in a computer as in the above embodiment.

What is claimed is:

1. A rewritable nonvolatile memory comprising:
   a block usage control table which indicates a usage status of each block of the nonvolatile memory;
   a data write section configured to write data to a block;
   a determining section configured to determine whether or not the data is correctly written to the block;
   a rewrite section configured to, if the determining section determines that the data is not correctly written to the block, write the data to another block; and
   a control table updating section configured to, after the rewrite section writes the data to the other block, change the usage status of the block to which the data is not correctly written by the write section and the usage status of the other block to which the data is correctly written by the rewrite section to a used status when said determining section determines that the data is correctly written to the other block.

2. The rewritable nonvolatile memory according to claim 1, wherein said rewriting section refers to said block usage control table to find an unused block, and writes the data to the unused block.

3. The rewritable nonvolatile memory according to claim 2, wherein said rewriting section, when said determining section determines that the data is not correctly written to the unused block, writes the data to another unused block.

4. The rewritable nonvolatile memory according to claim 2, wherein said rewriting section, when said determining section determines that the data is not correctly written to the unused block, stops a write operation.

5. The rewritable nonvolatile memory according to claim 1, wherein said rewriting section refers to said block usage control table to find a used block, and is inhibited to write the data to the used block.

6. A method of writing data to a rewritable nonvolatile memory comprising a block usage control table which indicates a usage status of each block of the nonvolatile memory, the method comprising:

finding an unused block by referring to the block usage control table;

writing data to the unused block;

determining whether or not the data is correctly written to the unused block;

rewriting, when it is determined that the data is not correctly written to the unused block, the data to another unused block and storing, as an address of a candidate of defective block, an address of the unused block to which the data is not correctly written;

terminating a rewrite operation when the number of the rewriting operations reaches a predetermined number;

determining whether or not the address of the candidate of defective block is stored when it is determined that the data is correctly written to the unused block; and changing the usage status of the unused block to which the data is correctly written and the usage status of the candidate of defective block to a used status and terminating a write operation.

7. The method according to claim 6, further comprising resetting the address of the candidate of defective block when the write operation is terminated.

8. A method of writing data to a rewritable nonvolatile memory comprising a block usage control table which indicates a usage status of each block of the nonvolatile memory, the method comprising:

finding an unused block by referring to the block usage control table;

writing data to the unused block;

determining whether or not the data is correctly written to the unused block;

storing, when it is determined that the data is not correctly written to the unused block, an address of the unused block as an address of a candidate of defective block and terminating a write operation;

determining whether or not the address of the candidate of defective block is stored when it is determined that the data is correctly written to the unused block;

changing the usage status of the unused block to which the data is correctly written and the usage status of the candidate of defective block to a used status; and continuing the write operation by returning the unused block finding if there are data to be written and terminating the write operation if there is no data to be written.

9. The method according to claim 8, further comprising resetting the address of the candidate of defective block when it is determined that the data is correctly written to the unused block.

10. A memory card comprising:

a flash memory capable of being rewritten data for each block; and a controller connected to the flash memory, the controller comprising:

a block usage control table which indicates a usage status of each block;

a flag set to an address of a block to which data is not correctly written; and an updating section configured to determine whether or not the data is correctly written to a block, storing an address of the block and repeatedly performing a writing operation by a predetermined number of times while changing a block when it is determined that the data is not correctly written, and updating, when it is determined that the data is correctly written, the block usage control table such that the usage status of the block and a block having the address to which the flag is set a used status.

* * * * *